(12) United States Patent
Tam et al.

(10) Patent No.: US 8,385,073 B2
(45) Date of Patent: Feb. 26, 2013

(54) FOLDED SYSTEM-IN-PACKAGE WITH HEAT SPREADER

(75) Inventors: Samuel Tam, Daly City, CA (US); Younes Shabany, San Jose, CA (US)

(73) Assignee: Flextronics AP, LLC, Broomfield, CO (US)

( * ) Notice: Subject to any disclaimer, the term of this patent is extended or adjusted under 35 U.S.C. 154(b) by 287 days.

(21) Appl. No.: 12/831,033

(22) Filed: Jul. 6, 2010

(65) Prior Publication Data

US 2011/0007479 A1 Jan. 13, 2011

Related U.S. Application Data

(60) Provisional application No. 61/223,969, filed on Jul. 8, 2009.

(51) Int. Cl.
*H05K 7/20* (2006.01)
*H05K 3/36* (2006.01)

(52) U.S. Cl. .................. 361/721; 361/679.54; 361/697; 361/702; 361/709

(58) Field of Classification Search .................. 361/689, 361/721; 29/830
See application file for complete search history.

(56) References Cited

U.S. PATENT DOCUMENTS

| 5,428,190 | A  | * | 6/1995  | Stopperan     | 174/261 |
| 7,408,253 | B2 | * | 8/2008  | Lin           | 257/686 |
| 2004/0218367 | A1 | * | 11/2004 | Lin et al.    | 361/721 |
| 2007/0211426 | A1 | * | 9/2007  | Clayton et al.| 361/689 |

* cited by examiner

*Primary Examiner* — Tuan T Dinh
*Assistant Examiner* — Mukund G Patel
(74) *Attorney, Agent, or Firm* — Marsh Fischmann & Breyfogle LLP

(57) ABSTRACT

A folded system-in-package (SiP) assembly is provided for minimizing the footprint of two corresponding circuit board modules in a handheld electronic device. The assembly includes top and bottom circuit board modules that are electrically interconnected through a flex circuit. Either a plate or wrapped heat spreader may be thermally coupled to the top circuit board module to conduct heat from the heat-generating components mounted to the top circuit board module and to a case of the electronic device.

11 Claims, 10 Drawing Sheets

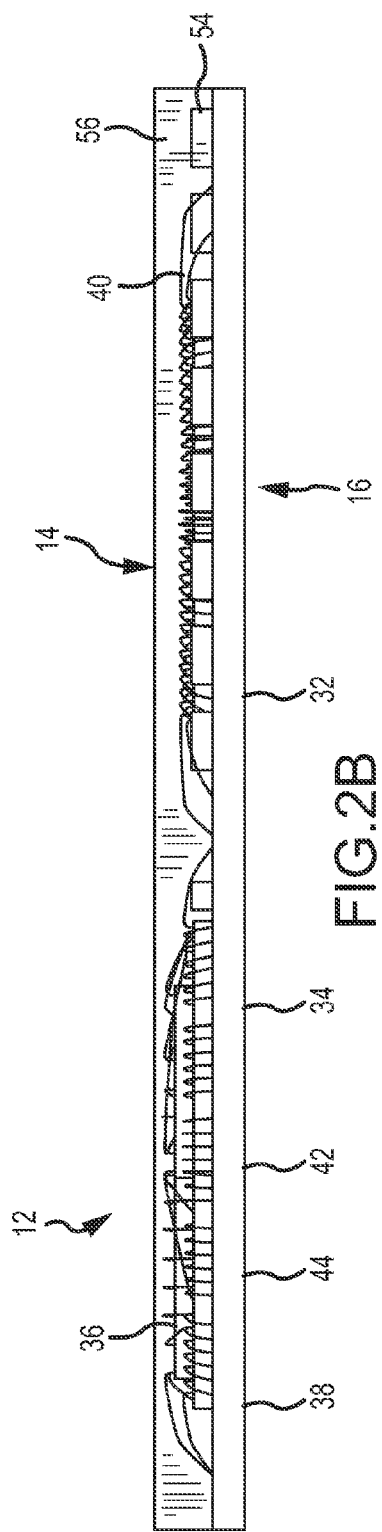
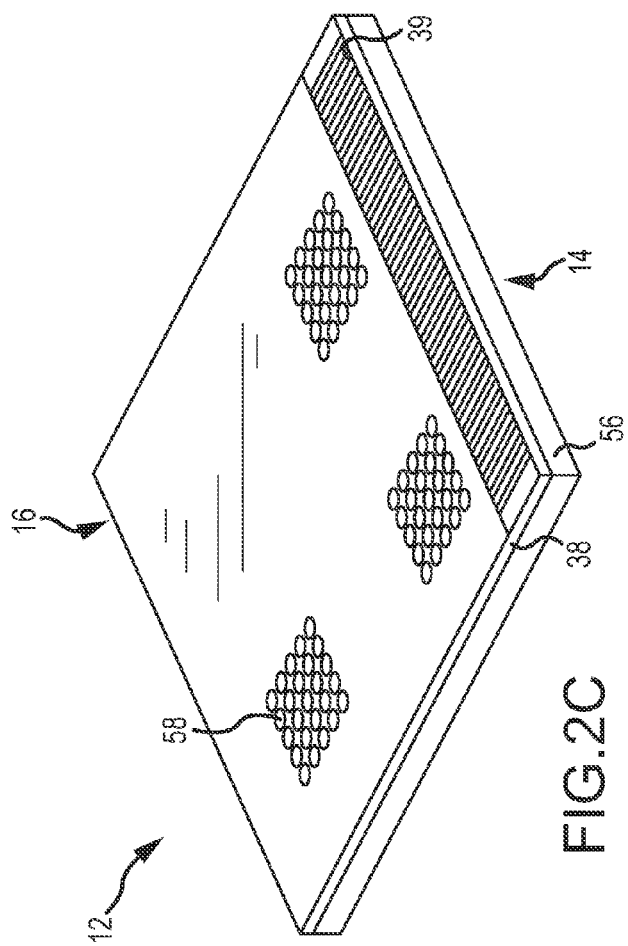

FOLDED SYSTEM-IN-PACKAGE WITH HEAT SPREADER

CROSS-REFERENCE TO RELATED APPLICATION

This application claims priority under 35 U.S.C. 119 to U.S. Provisional Application No. 61/223,969, entitled "FOLDED SYSTEM-IN-PACKAGE WITH HEAT SPREADER," filed on Jul. 8, 2009, the contents of which are incorporated herein as if set forth in full.

BACKGROUND

In the field of consumer electronic devices, such as wireless phones and portable music players, there is constant pressure to make the devices more compact, less expensive, and more rich with features. In turn, the manufacturers of such devices place the same pressures on each of their suppliers. Traditionally, larger circuit boards could be used to accommodate the additional, oftentimes more powerful, electronic components necessary to provide the desired features. Today, however, the increased pressure to minimize the overall size of electronic devices carries over to the circuit boards that power and control them.

Thus, even as more robust functionality is added to device circuitry, the semiconductor packaging containing the device circuitry must continually decrease in size. Early semiconductor packaging techniques provided a single horizontal layer of silicon chips or die (e.g., integrated circuits ("ICs"), memory chips) to be mounted side-by-side on a substrate and encapsulated or enclosed within a package. Today, packaging technologies have evolved to allow two or more die of varying function or technology (e.g., logic, analog, mixed-signal) to be stacked or integrated on a substrate or printed circuit board ("PCB") in a vertical fashion. This concept, often referred to as "die stacking" or manufacturing a "system-in-package" ("SiP"), significantly increases the amount of silicon chip area that can be housed within a single package of a given footprint, conserving precious real estate on the PCB and simplifying the board assembly process.

The foregoing examples of the related art and limitations related therewith are intended to be illustrative and not exclusive. Other limitations of the related art will become apparent to those of skill in the art upon a reading of the specification and a study of the drawings.

SUMMARY

Disclosed herein is a folded system-in-package assembly. The folded system-in-package assembly includes a top circuit board module having a first side and a second side and including one or more active electrical components; a bottom circuit board module having a first side and a second side and including one or more active electrical components, wherein the top circuit board module is stacked relative to the bottom circuit board module such that the first side of the top circuit board module and the first side of the bottom circuit board module face each other in an opposing manner; a flex circuit electrically interconnecting the top and bottom circuit board modules; and a heat spreader thermally coupled to the second side of the top circuit board module.

The heat spreader of the folded system-in-package may comprise a metal layer having a perimeter that is subsumed within a perimeter of the top circuit board module. The metal layer may be a metal plate. The heat spreader may also comprise a folded metal layer that extends from the second side of the top circuit board module to the second side of the bottom circuit board module, wherein the heat spreader covers at least a substantial majority of the second side of the top circuit board module and the second side of the bottom circuit board module. The heat spreader may extend beyond one or both of a perimeter of the second side of the top circuit board module and a perimeter of the second side of the bottom circuit board module. The heat spreader may be a foil wrap formed of copper.

The top circuit board module may include a substrate having a plurality of thermal vias that extend therethrough, and the plurality of thermal vias may be thermally coupled to the heat spreader on the second side of the top circuit board module. One or more of the active electrical components may be grouped within an integrated circuit positioned on the first side of the top circuit board module, and the thermal vias may make thermal contact with the integrated circuit. One or both of the top and bottom circuit board modules may include high density logic circuits, and a substantial majority of the high density logic circuits may be located on the top circuit board module. The system-in-package may provide drive circuitry for driving a light engine of a pico-projector.

Also disclosed is a method for manufacturing a folded system-in-package assembly. The method includes providing a top circuit board module, said top circuit board module having a first side and a second side and including one or more active electrical components; providing a bottom circuit board module having a first side and a second side and including one or more active electrical components; stacking the top circuit board module relative to the bottom circuit board module such that the first side of the top circuit board module and the first side of the bottom circuit board module oppose each other; using a flexible circuit, electrically interconnecting the top and the bottom circuit board modules; and thermally coupling a heat spreader to at least one of the second side of the top circuit board module and the second side of the bottom circuit board module.

The thermally coupling may include thermally coupling the heat spreader to the second side of the top circuit board module, and the heat spreader may comprise a metal plate that is subsumed within a perimeter of the top circuit board module. The heat spreader may also comprise a folded metal sleeve that extends about the top and bottom circuit board modules. The folded metal sleeve may extend from the second side of the top circuit board module to the second side of the bottom circuit board module, and the folded metal sleeve may cover at least a substantial majority of the second side of the top circuit board module and the second side of the bottom circuit board module. The folded metal sleeve may extend beyond one or both of a perimeter of the second side of the top circuit board module and a perimeter of the second side of the bottom circuit board module. The heat spreader may be formed of copper.

The method may further include extending a plurality of thermal vias through the top circuit board module and thermally coupling the thermal vias to one or more of the active electrical components on the first side of the top circuit board module and to the heat spreader on the second side of the top circuit board module. One or both of the top and bottom circuit board modules may include high density logic circuits, and a substantial majority of the high density logic circuits may be located on the top circuit board module. The system-in-package assembly manufactured according to the disclosed method may be electrically interconnected with a light engine for a pico-projector such that the system-in-package assembly may provide drive circuitry for the light engine.

BRIEF DESCRIPTION OF THE DRAWINGS

FIG. 2B is a front view of the top circuit board module of FIG. 2A.

FIG. 2C is a bottom perspective view of the top circuit board module of FIGS. 2A-B.

DETAILED DESCRIPTION

Reference will now be made to the accompanying drawings, which assist in illustrating the various pertinent features of the present invention. Although the present invention is described primarily in conjunction with a folded system-in-package containing folded or stacked circuit board modules for driving a pico-projector light engine to be implemented in, for example, a handheld accessory such as a mobile phone or digital camera, it should be expressly understood that the present invention may be applicable to other applications where it is desirable to fold or stack more than one circuit board module. In this regard, the following description is presented for purposes of illustration and description and is not intended to limit the invention to the form disclosed herein. Consequently, variations and modifications commensurate with the following teachings, and skill and knowledge of the relevant art, are within the scope of the present invention. The embodiments described herein are further intended to explain modes known of practicing the invention and to enable others skilled in the art to utilize the invention in such or other embodiments and with various modifications required by the particular application(s) or use(s) of the invention.

Figure 1:
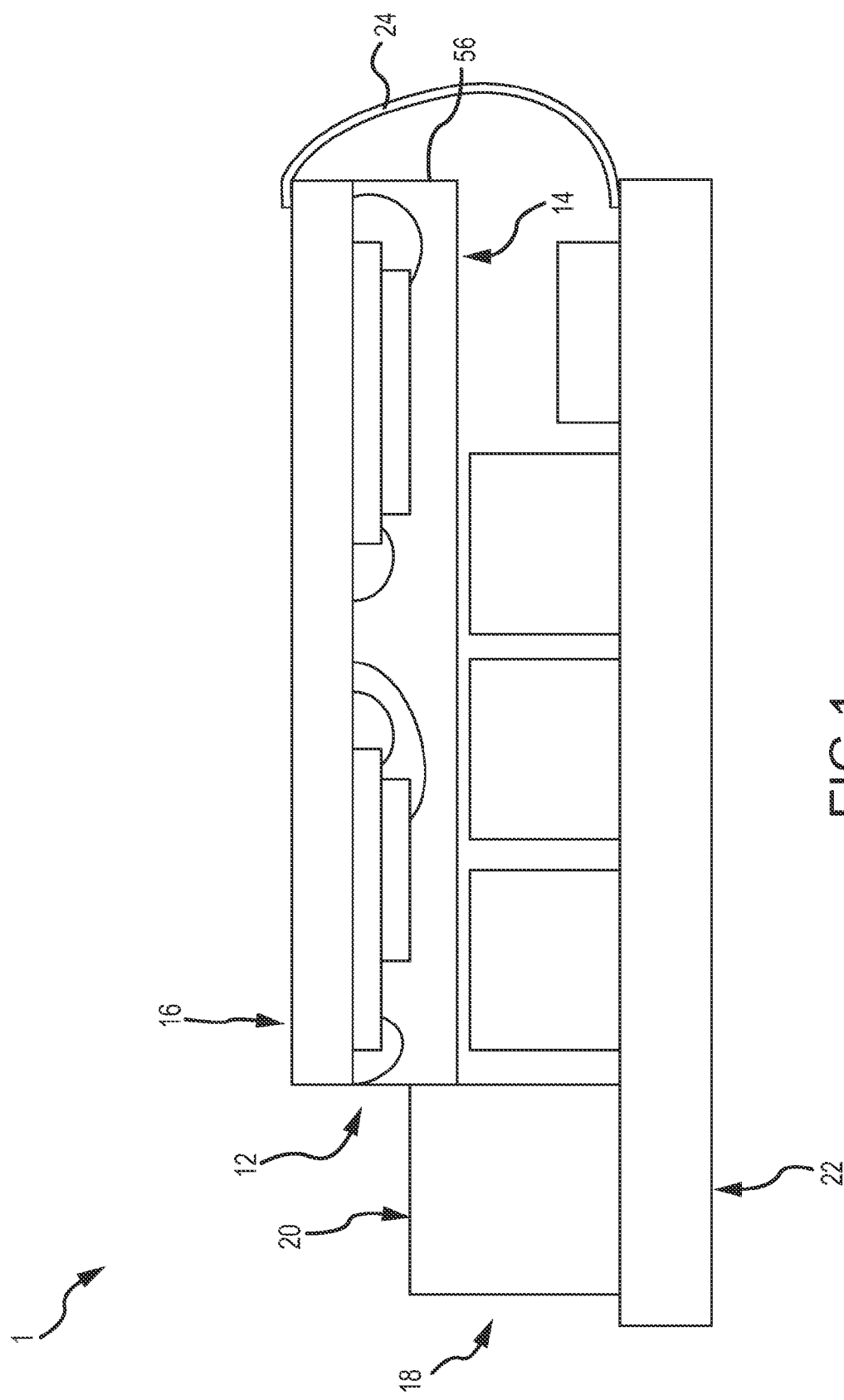
FIG. 1 is a side view of one embodiment of a folded system-in-package assembly.
Figure 2A:
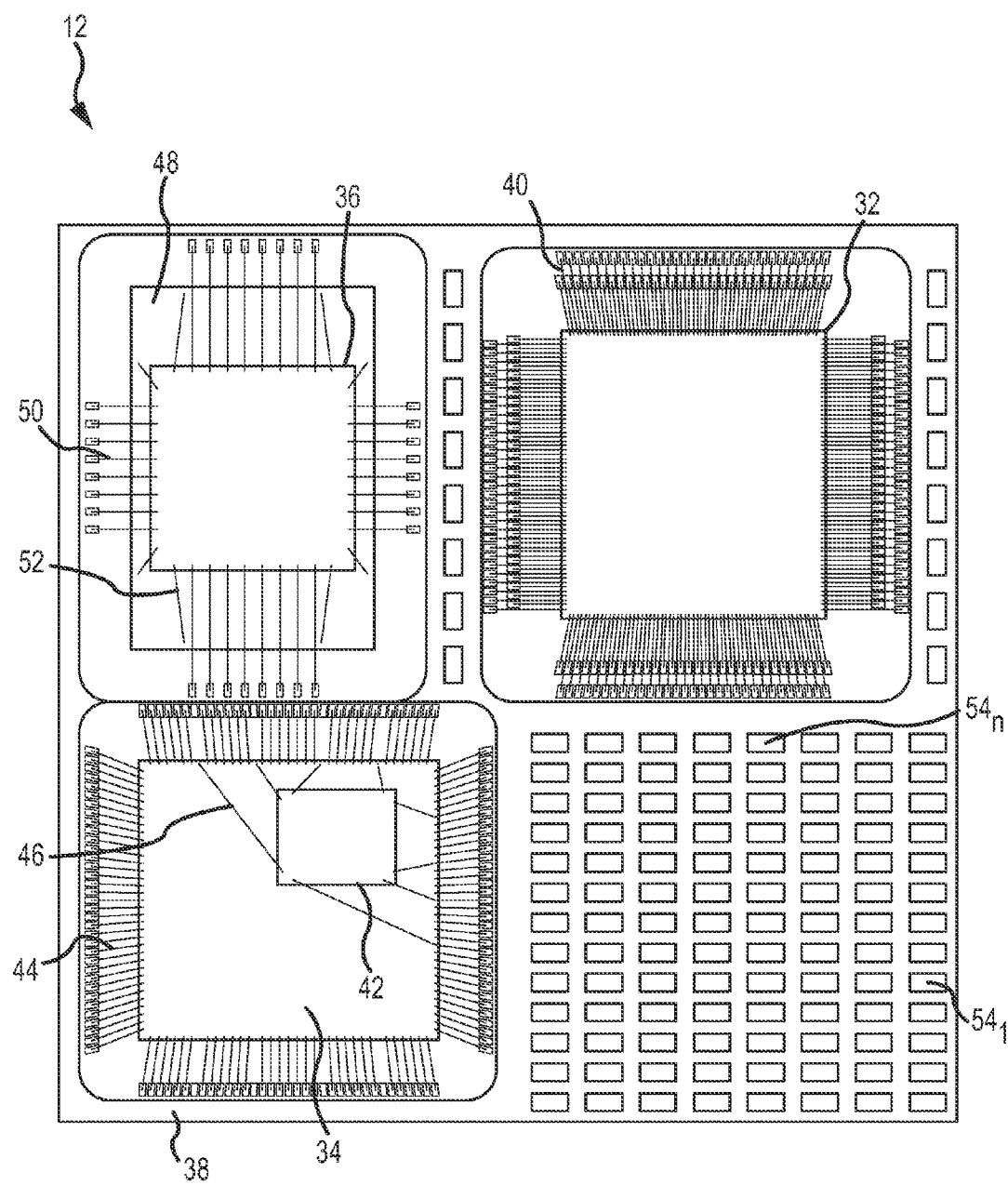
FIG. 2A is a top view of a top circuit board module of another embodiment of a folded system-in-package assembly.

Despite the advancements in packaging technology discussed above (i.e., die stacking or manufacturing a system-in-package), the immense consumer demand for increasingly compact, feature rich electronic devices continues to drive makers of electronic components to seek ways to effectively reduce the footprint of semiconductor packaging while increasing the number and capability of the semiconductor devices within the package. In this regard, FIG. 1 illustrates one embodiment of a folded SiP assembly 1 that includes two separate circuit board modules. Specifically, the folded SiP assembly 1 includes a top circuit board module 12 having a first side 14 and a second side 16. The SiP assembly 1 also includes a bottom circuit board module 18 that has a first side 20 and a second side 22. The top and bottom circuit board modules 12, 18 are folded onto each other such that the first side 14 of the top circuit board module 12 and the first side 20 of the bottom circuit board module 18 face each other in an opposing manner. Each of the top and bottom circuit board modules 12, 18 includes a respective bond finger 39, 64 (FIGS. 2C and 3B). The bond fingers 39, 64 are electrically interconnected through an anisotropic conductive film bonding ("ACF") flex circuit 24, as detailed below.

The top and bottom circuit board modules 12, 18 may be any circuit board modules of an appropriate size, shape, type, and/or configuration. For instance, in one embodiment, the top circuit board module 12 is an SiP, or more specifically, a high density interconnect ("HDI") module, as shown in FIGS. 2A-C. In this embodiment, the top circuit board module 12 includes a first application-specific integrated circuit ("ASIC") 32, a second ASIC 34, and a third ASIC 36 that may, for instance, be designed to control a light engine for a pico-projector for use in a handheld device. The first ASIC 32 stands alone and is wirebonded to a substrate 38 through multiple wire bond loops 40. The second ASIC 34 is vertically stacked beneath a 2 MB flash memory chip 42. The second ASIC 34 is wirebonded to the substrate 38 through multiple wire bond loops 44, and the flash memory chip 42 is wirebonded to the second ASIC 34 through multiple wire bond loops 46. The third ASIC 36 is stacked over a 64 MB flash memory chip 48 and is wirebonded to both the substrate 38 and the flash memory chip 48 through wire bonds 50, 52, respectively.

In addition to the stand-alone first ASIC 32 and the stacked die incorporating the second and third ASICs 34, 36, the top circuit board module 12 includes a number of passive electrical components $54_{1-n}$. These passive components may include any appropriate passive electrical components including, for example, 0201 size resistors and capacitors. As discussed above, the top circuit board module 12 also includes the bond finger 39 (FIG. 2C) for electrically interconnecting to the bottom circuit board module 18, as discussed in greater detail below.

To protect the delicate semiconductor devices of the top circuit board module 12 from physical and environmental damage (e.g., vibrational damage, corrosion), both the active and passive components mounted to the substrate 38 of the top circuit board module 12 are encapsulated in a molding compound or encapsulant 56, as shown in FIGS. 2B-2C. The encapsulant 56 may be translucent or opaque and may be formed of any appropriate material including, for example, a polymer or epoxy thermoset material. The encapsulant is molded (e.g., transfer molded) around the semiconductor devices mounted to the substrate 38 to form a solid monolithic unit that is sealed from environmental damage and is rugged enough to withstand physical trauma from assembly and use.

Arrays of thermal vias 58 assist in dissipating heat generated by the dense population of active electrical components in each of the ASICs 32, 34, 36. As shown in FIG. 2C, the arrays of thermal vias 58 extend from beneath each of the ASICs 32, 34, 36 on the first side 14 of the top circuit board module 12 and through the substrate 38 in order to conduct heat away from the ASICs 32, 34, 36 and to a heat spreader 68, 68' (FIGS. 4-10) positioned on the second side 16 of the top circuit board module 12. The heat spreader 68, 68' may be added to the folded SiP assembly of FIG. 1, and the role of the heat spreader will be discussed in detail below with reference to FIGS. 4-10. The thermal vias 58 may be formed of a high thermal conductivity material such as copper.

Figure 3A:
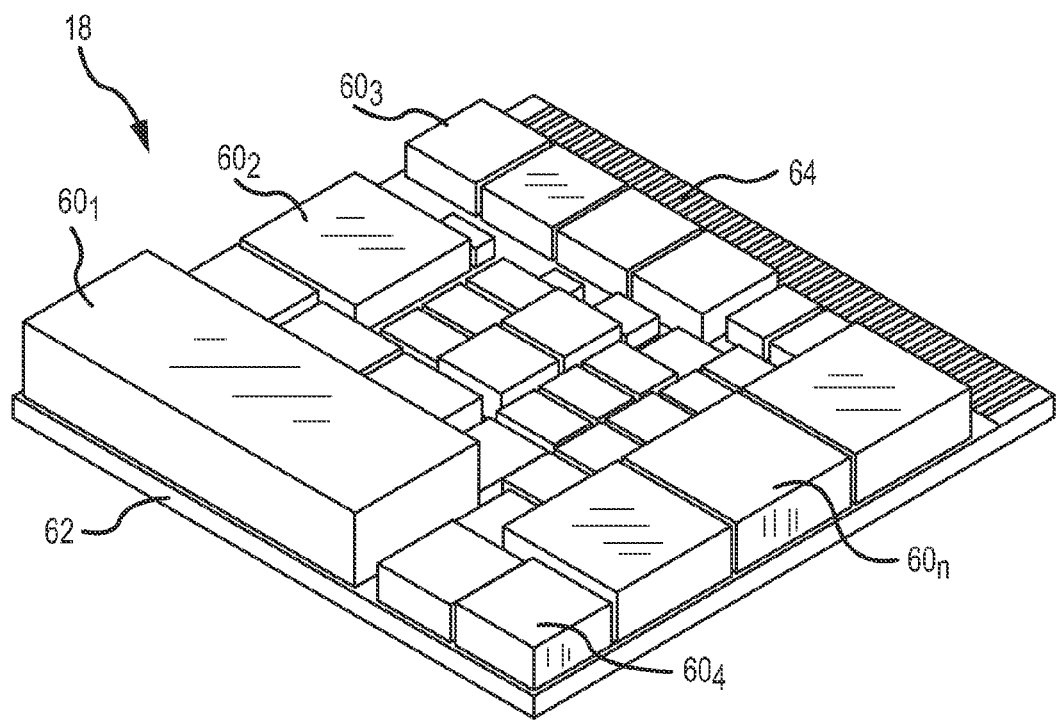
FIG. 3A is a top perspective view of a bottom circuit board module of another embodiment of a folded system-in-package assembly.
Figure 3B:
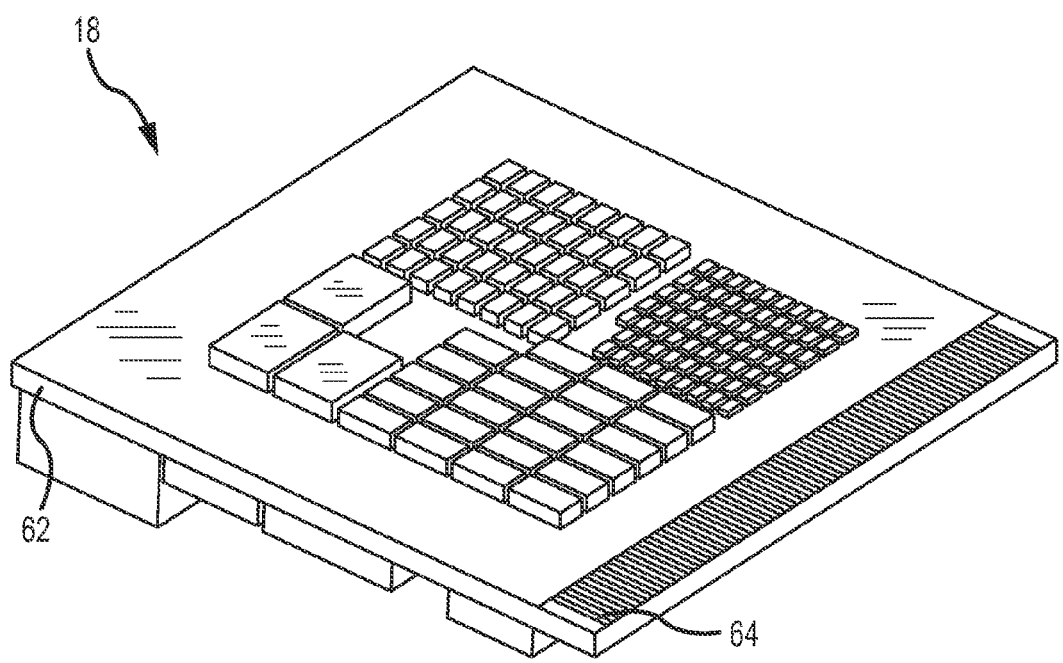
FIG. 3B is a bottom perspective view of the bottom circuit board module of FIG. 3A.
Figure 3C:
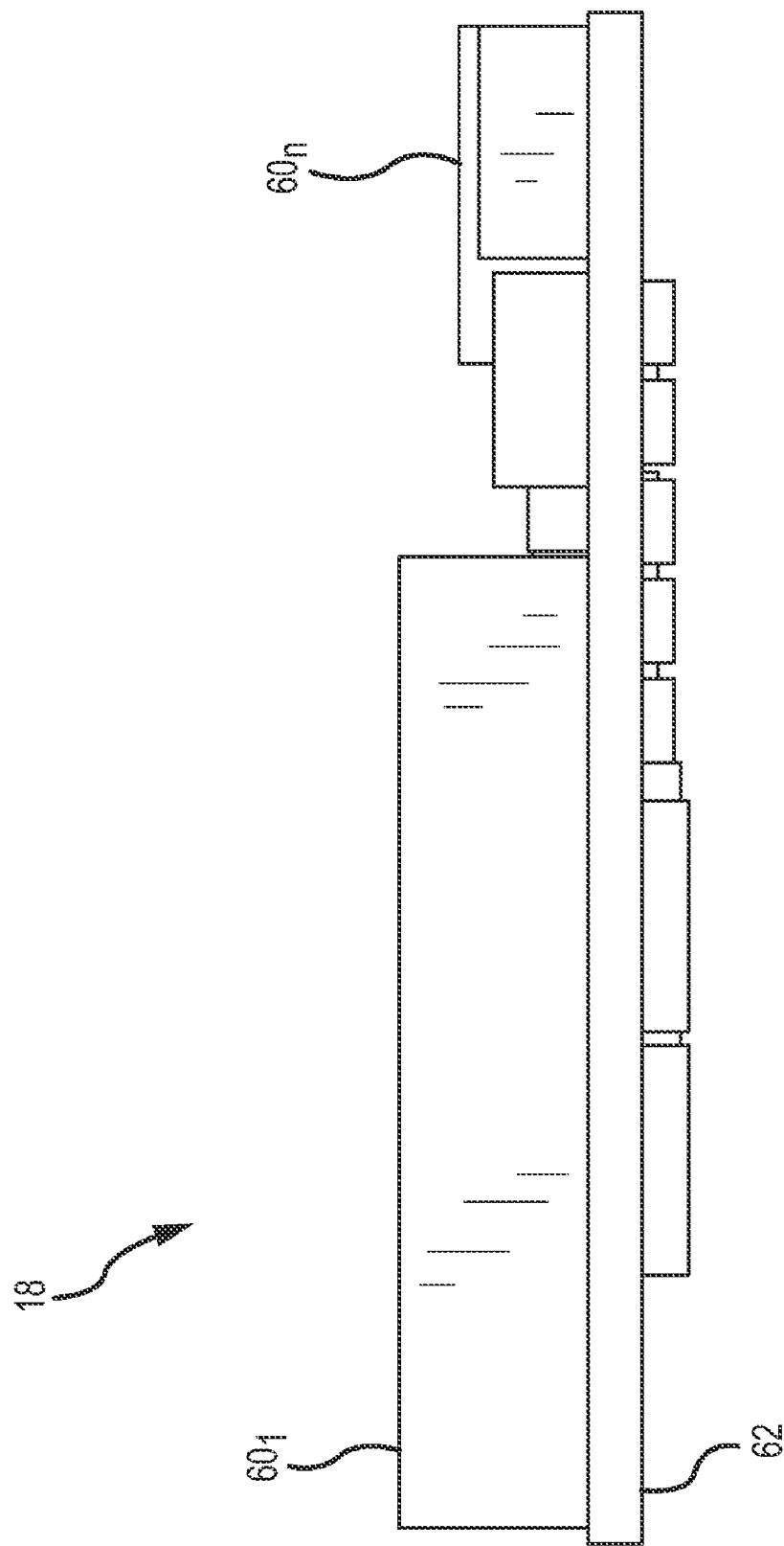
FIG. 3C is a side view of the bottom circuit board module of FIGS. 3A-B.

One embodiment of the bottom circuit board module 18 is shown in FIGS. 3A-C. In this embodiment, the bottom circuit board module 18 is a PCB module that includes various active and passive surface-mount components $60_{1-n}$ for use in driving a light engine for a pico-projector. The components $60_{1-n}$ may include, for example, a crystal clock oscillator (e.g., XTAL A SE 2.5×2.0), shielded power inductors (e.g., LPS 4018, LPS 4012), power supplies, surface-mount resistors, capacitors, and transistors of varying package sizes, and the like. The components $60_{1-n}$ are mounted upon a PCB 62 that includes traces (not shown) that are routed to the bond finger 64 for use in interconnecting to the top circuit board module 12.

The manufacturing and material costs of the folded SiP assembly 1 are significantly reduced by grouping the high density ASICs 32, 34, 36 onto the top circuit board module 12 (e.g., an HDI substrate) and the lower density surface-mount components and chips onto the bottom circuit board module 18 (e.g., a conventional PCB substrate). This cost reduction stems from having to perform the high-cost, time and material intensive manufacturing processes associated with high density ASIC circuits (e.g., die bonding, wire bonding, transfer molding, high density interconnect technologies such as laser writing patterns of interconnect layouts, microvia hole drilling, fine pitch solder bumping, and wafer/die stacking) in connection with only one, rather than two, substrates or circuit board modules.

Figure 4:
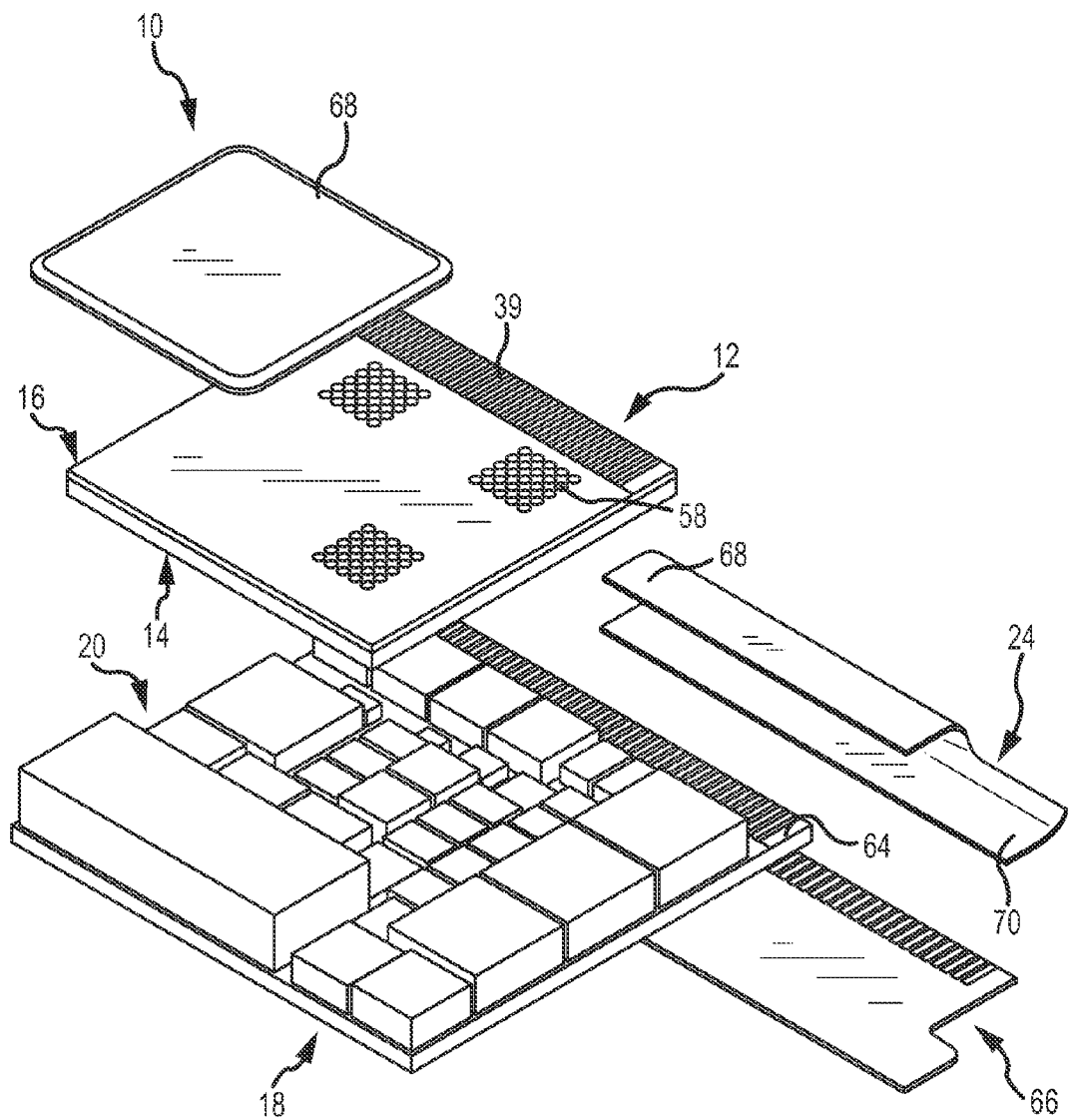
FIG. 4 is an exploded perspective view of another embodiment of a folded system-in-package assembly.

FIG. 4 illustrates an exploded view of an exemplary folded SiP assembly 10, which is a variation of the folded SiP assembly 1 of FIG. 1. Corresponding component illustrations of these two embodiments are identified by the same reference numerals. Corresponding component illustrations that differ in at least some respect are further identified by a "single prime" designation.

Figure 5:
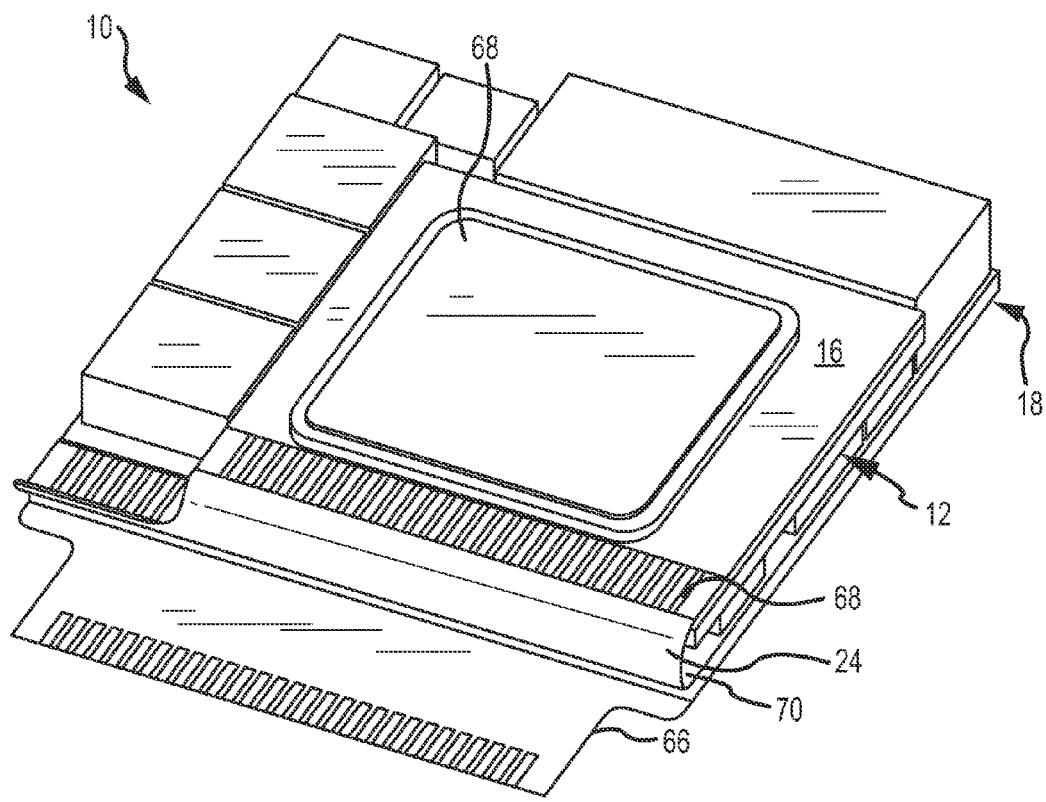
FIG. 5 is a top perspective view of the folded system-in-package assembly of FIG. 4.
Figure 6:
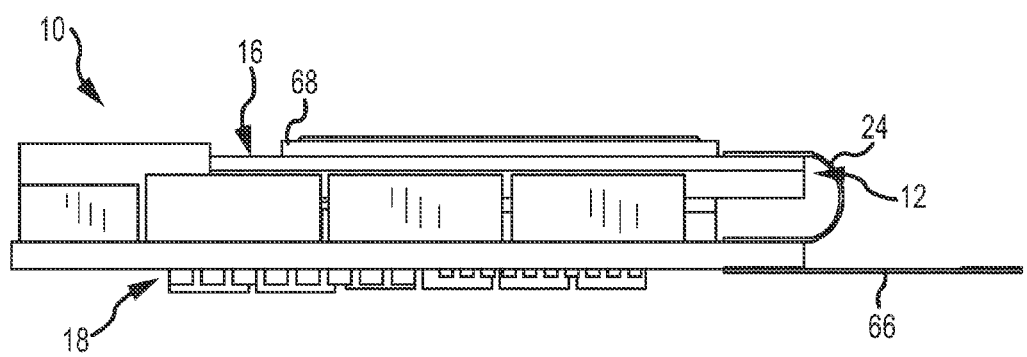
FIG. 6 is a side view of the folded system-in-package assembly of FIGS. 4-5.
Figure 7:
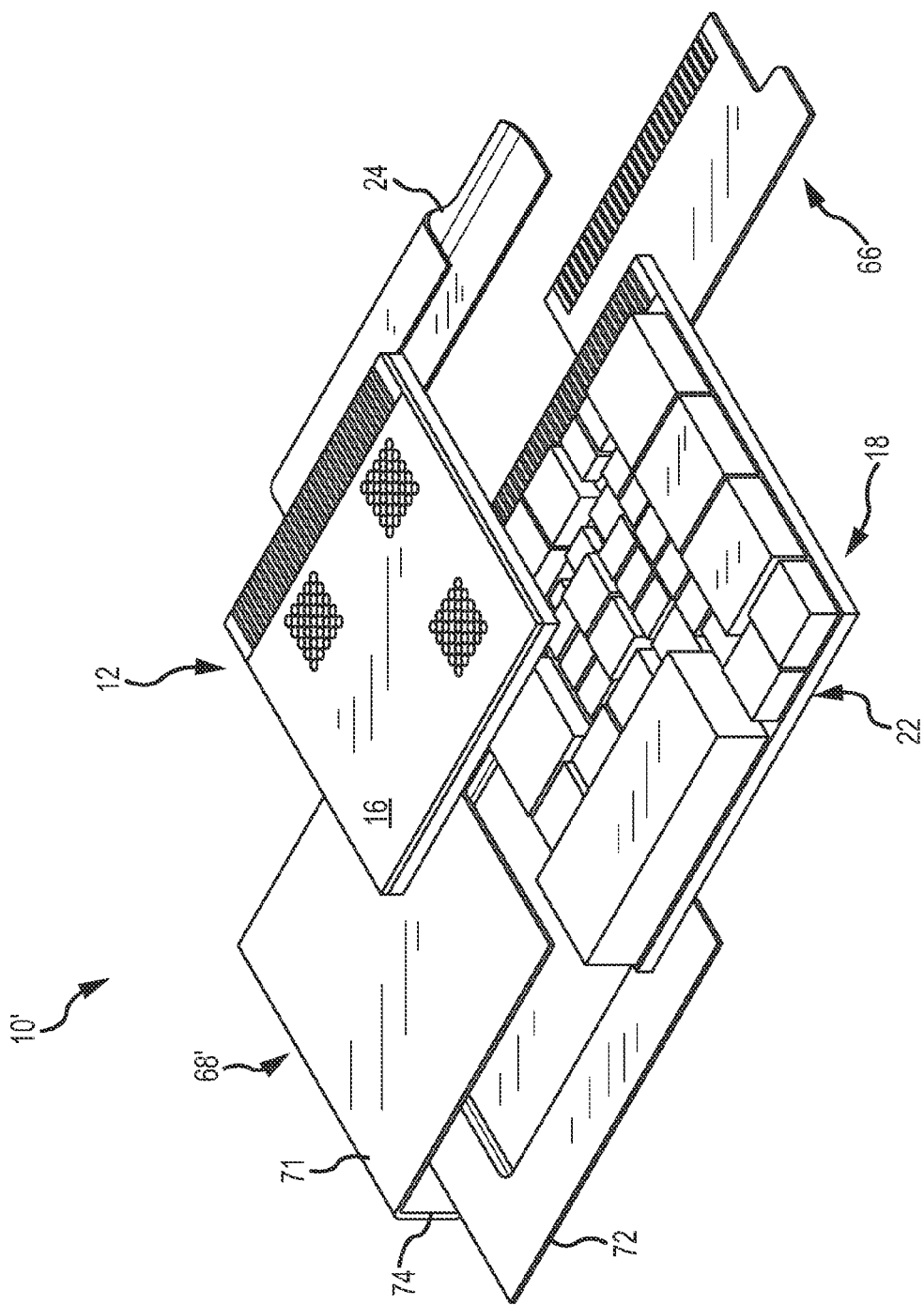
FIG. 7 is an exploded perspective view of another embodiment of a folded system-in-package assembly.

The folded SiP assembly 10 includes the top and bottom circuit board modules 12, 18 as well as the flex circuit 24, discussed above, and a flex board 66 for external connection of the folded SiP assembly 10. The top circuit board module 12 is positioned parallel to the bottom circuit board module 18 such that the first sides 14, 20 of the top and bottom circuit board modules 12, 18 face each other in an opposing manner. The flex circuit 24 is shaped in a c-curve such that a top flange 68 contacts the bond finger 39 of the top circuit board module 12 and a bottom flange 70 contacts the bond finger 64 of the bottom circuit board assembly 18 to create an electrical interconnection between the top and bottom circuit board modules 12, 18 when the two modules are assembled as shown in FIGS. 5-6. The flex board 66 contacts an opposite side of the bond finger 64 such that the folded SiP assembly 10 may be externally connected with, for example, a light engine for a pico-projector for a handheld device.

Folding two circuit board modules in the manner described above allows for further miniaturization of semiconductor packaging in that manufacturers may vertically stack not only silicon die within a single package, but also the circuit board modules that incorporate the stacked silicon die. That said, while reducing the package footprint in this manner saves valuable PCB real estate, it introduces thermal management challenges because there are increased heat-generating components populating a smaller surface area, making it more difficult to cool the assembly (such as the assembly 10, 10' of FIGS. 4-10). In this regard, a heat spreader (such as the heat spreader 68, 68' of FIGS. 4-10) may be incorporated into the folded SiP assembly 10, 10' in order to increase the surface area of heat dissipation and improve the thermal characteristics of the assembly 10, 10'.

FIGS. 4-6 show that the folded SiP assembly 10 includes a heat spreader plate 68 for attachment to the second side 16 of the top circuit board module 12. The heat spreader plate 68 may be formed of any appropriate thermally conductive metal, including, for example, copper or silicon carbide. The heat spreader plate 68 may be mechanically and thermally coupled to the exposed thermal vias 58 on the second side 16 of the top circuit board module 12 in any appropriate manner. In one embodiment, the heat spreader plate 68 is adhered to the top circuit board module 12 and the thermal vias 58 with a thermally conductive adhesive such as, for example, DM4131HT thermoset adhesive paste made by Diemat, Inc., although any other means for attaching the heat spreader 68 to the top circuit board module 12 in a thermally conductive manner may be employed.

FIGS. 5 and 6 show top perspective and side views of the folded SiP assembly 10, respectively. Specifically, these Figures show that, in this embodiment, a perimeter of the heat spreader plate 68 is fully subsumed within the perimeter of the top circuit board 12. In other embodiments, the heat spreader plate 68 may be any appropriate size. For instance, the heat spreader plate 68 may cover the entire second side 16 of the top circuit board 12 or extend beyond a perimeter of the top circuit board 12. In addition, while a larger plate thickness may provide more effective heat transfer, the thickness of the plate is bounded by the desired total thickness of the folded SiP assembly 10.

Figure 8:
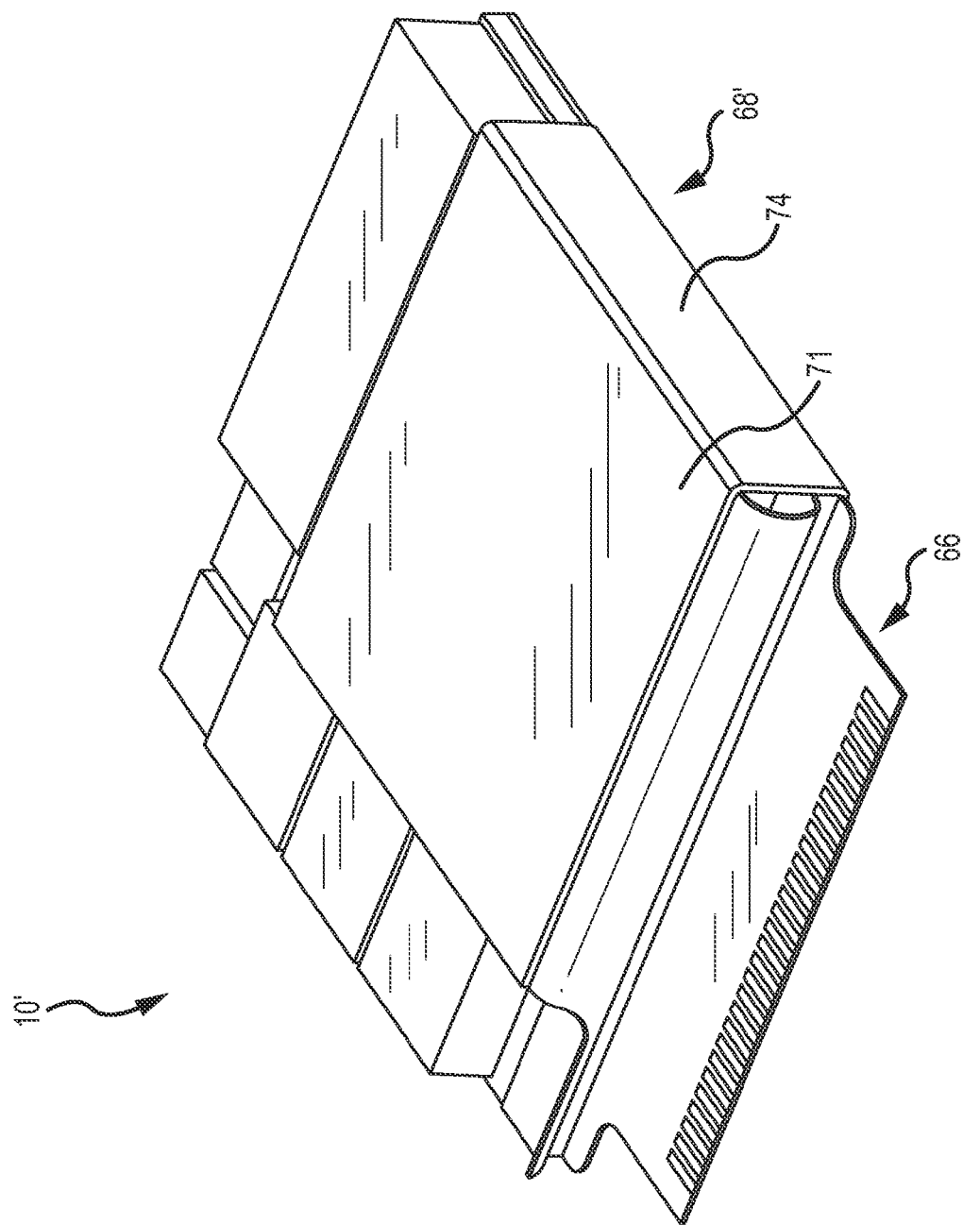
FIG. 8 is a top perspective view of the folded system-in-package assembly of FIG. 7.
Figure 9:
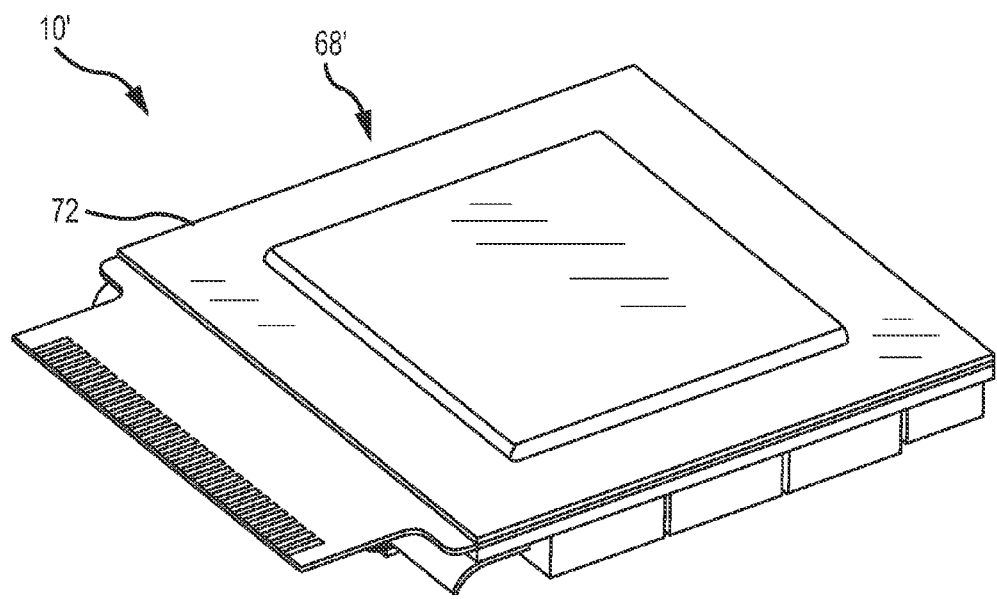
FIG. 9 is a bottom perspective view of the folded system-in-package assembly of FIGS. 7-8.
Figure 10:
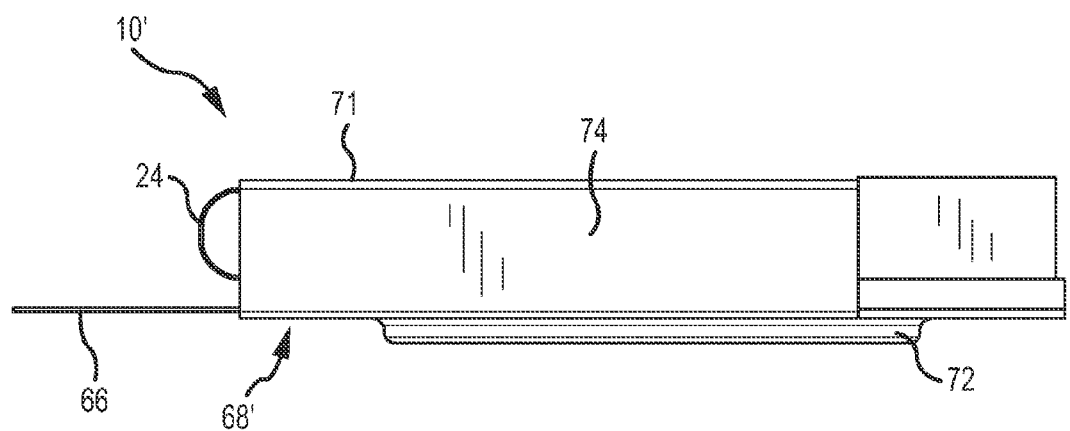
FIG. 10 is a side view of the folded system-in-package assembly of FIGS. 7-9.

FIGS. 7-10 show a variation of the folded SiP assembly 10, which is identified by the reference numeral 10'. Corresponding component illustrations of these two embodiments are identified by the same reference numerals. Corresponding component illustrations that differ in at least some respect are further identified by a "single prime" designation. Specifically, the folded SiP assembly 10' differs from folded SiP assembly 10 only in that it includes a wrapped heat spreader 68' rather than the heat spreader plate 68. The wrapped heat spreader 68' is formed of a folded metal foil that includes a top portion 71, a bottom portion 72, and a side portion 74. When assembled as shown in FIGS. 8-10, the top portion 71 of the wrapped heat spreader 68' forms a sleeve that covers all or a substantial portion of the second side 16 of the top circuit board module 12. In addition, the wrapped heat spreader 68' may extend beyond a perimeter of the top circuit board module 12 so long as it remains within a perimeter of the bottom circuit board module 18. The bottom portion 72 covers all or a substantial portion of the second side 22 of the bottom circuit board module 18, and the side portion 74 extends between the top circuit board module 12 and the bottom circuit board module 18.

Similar to the heat spreader plate 68, the top portion 71 of the wrapped heat spreader 68' may be mechanically and thermally coupled to the exposed thermal vias 58 on the second side 16 of the top circuit board module 12 and the bottom portion 72 of the wrapped heat spreader 68' may be mechanically and thermally coupled to the second side 22 of the bottom circuit board module 18 in any appropriate manner, including, for example, a thermally conductive adhesive. In this embodiment, the majority of the heat-generating components are located in the ASICs 32, 34, 36 on the top circuit board module 12. Thus, the thermal coupling between the second side 16 of the top circuit board module 12 and the top portion 71 of wrapped heat spreader 68' may be more important than the thermal coupling between the second side 22 of the bottom circuit board module 18. Of course, the top and bottom circuit board modules 12, 18 may include any appropriate components, and therefore, the need for couplings may exist with either or both of the top and bottom circuit board modules 12, 18.

While the embodiment shown in FIGS. 7-10 depicts the top portion 71 of the wrapped heat spreader 68' as extending to a perimeter of the top circuit board module 12 and the bottom portion 72 of the wrapped heat spreader 68' as extending to a perimeter of the bottom circuit board module 18, it should be understood that the wrapped heat spreader 68' may have any appropriate dimensions that allow the heat spreader to leverage heat dissipation across both the top and bottom circuit board modules 12, 18, including completely encasing the assembly 10'.

The wrapped heat spreader 68' may be formed of any appropriate folded material, including, for example, a copper foil wrap. In one embodiment, the wrapped heat spreader 68' may have a minimum thickness of 0.25 mm to promote optimum heat transfer. In addition, the wrapped heat spreader 68' may be separately manufactured before being attached to the assembled top and bottom circuit board modules 12, 18. Alternatively, the wrapped heat spreader 68' could be overlaid upon and attached to the top circuit board module 12 before being folded and attached to the bottom circuit board module 18 as part of a unitary manufacturing process. In other words, the folding and mechanical attachment of the wrapped heat spreader 68' could be accomplished through a single manufacturing process for the entire folded SiP assembly 10'.

When incorporated into an electronic device, heat is conducted away from the active components located on the top and bottom circuit board modules 12, 18 and to the heat spreader 68, 68'. From there, heat collected in the heat spreader 68, 68' radiates from the heat spreader 68, 68' to a case of the electronic device, which is comparatively cooler than the heat spreader 68, 68'. In this manner, the folded SiP assembly effectively minimizes the footprint of two densely populated circuit board modules, while providing a cost effective and efficient mechanism for cooling the miniaturized semiconductor package. Further, some portable handheld devices include contingency cooling fans. For instance, in the context of a pico-projector for a handheld device, a contingency fan may operate only when the projector is operating. In these cases, the forced air from the fan would further assist in radiating heat from the heat spreader 68, 68' to the case of the device to provide even more effective cooling. The foregoing description has been presented for purposes of illustration and description. Furthermore, the description is not intended to limit the invention to the form disclosed herein.

While a number of exemplary aspects and embodiments have been discussed above, those of skill in the art will recognize certain variations, modifications, permutations, additions, and sub-combinations thereof. Accordingly, it should be understood that the particular values of the circuit components described herein could be varied and achieve the same objectives. The values given herein are merely exemplary. It is therefore intended that the following appended claims and claims hereafter introduced are interpreted to include all such variations, modifications, permutations, additions, and sub-combinations as are within their true spirit and scope.

What is claimed is:

1. A folded system-in-package assembly, comprising:
   a top circuit board module having a first side and a second side and including one or more active electrical components, wherein the top circuit board module includes a substrate having a plurality of thermal vias that extend therethrough from the first side to the second side of the top circuit board module;
   a bottom circuit board module having a first side and a second side and including one or more active electrical components, wherein the active electrical components of one or both of the top and bottom circuit board modules form one or more high density logic circuits, wherein a majority of the high density logic circuits are located on the first side of the top circuit board module, wherein the thermal vias make thermal contact with the one or more high density logic circuits of the top circuit board module, and wherein the top circuit board module is stacked relative to the bottom circuit board module such that the first side of the top circuit board module and the first side of the bottom circuit board module face each other in an opposing manner;
   a flex circuit electrically interconnecting the top and bottom circuit board modules; and
   a heat spreader thermally coupled to the second side of the top circuit board module, wherein the plurality of thermal vias are thermally coupled to the heat spreader, wherein the heat spreader comprises a folded metal layer that extends from the second side of the top circuit board module to the second side of the bottom circuit board module, and wherein the heat spreader covers at least a substantial majority of the second side of the top circuit board module and the second side of the bottom circuit board module.

2. The folded system-in-package assembly of claim 1, wherein the heat spreader comprises a metal layer having a perimeter that is subsumed within a perimeter of the top circuit board module.

3. The folded system-in-package assembly of claim 2, wherein the metal layer is a metal plate.

4. The folded system-in-package assembly of claim 1, wherein the heat spreader extends beyond one or both of a perimeter of the second side of the top circuit board module and a perimeter of the second side of the bottom circuit board module.

5. The folded system-in-package assembly of claim 1, wherein the heat spreader is a foil wrap formed of copper.

6. The folded system-in-package assembly of claim 1, wherein the system-in-package provides drive circuitry for driving a light engine of a pico-projector.

7. A method for manufacturing a folded system-in-package assembly, comprising:
   providing a top circuit board module, said top circuit board module having a first side and a second side and including one or more active electrical components;
   providing a bottom circuit board module having a first side and a second side and including one or more active electrical components, wherein the active electrical components of one or both of the top and bottom circuit board modules form one or more high density logic circuits, wherein a majority of the high density logic circuits are located on the first side of the top circuit board module;
   stacking the top circuit board module relative to the bottom circuit board module such that the first side of the top circuit board module and the first side of the bottom circuit board module oppose each other;
   using a flexible circuit, electrically interconnecting the top and the bottom circuit board modules;
   thermally coupling a heat spreader to at least one of the second side of the top circuit board module and the second side of the bottom circuit board module, wherein the heat spreader comprises a folded metal sleeve that extends about the top and bottom circuit board modules, wherein the folded metal sleeve extends from the second side of the top circuit board module to the second side of the bottom circuit board module, and wherein the folded metal sleeve covers at least a substantial majority of the second side of the top circuit board module and the second side of the bottom circuit board module;

extending a plurality of thermal vias through the top circuit board module; and thermally coupling the thermal vias to the one or more high density logic circuits of the top circuit board module and to the heat spreader.

8. The method of claim 7, wherein the thermally coupling comprises thermally coupling the heat spreader to the second side of the top circuit board module, and wherein the heat spreader comprises a metal plate that is subsumed within a perimeter of the top circuit board module.

9. The method of claim 7, wherein the folded metal sleeve extends beyond one or both of a perimeter of the second side of the top circuit board module and a perimeter of the second side of the bottom circuit board module.

10. The method of claim 7, wherein the heat spreader is formed of copper.

11. A method for using a folded system-in-package assembly manufactured according to the method of claim 7, comprising:

electrically interconnecting the folded system-in-package assembly with a light engine for a pico-projector such that the system-in-package assembly provides drive circuitry for the light engine.

* * * * *